United States Patent [19]

Pathak et al.

[11] Patent Number: 5,731,734
[45] Date of Patent: Mar. 24, 1998

[54] ZERO POWER FUSE CIRCUIT

[75] Inventors: Jagdish Pathak, Los Altos Hills; James E. Payne, Boulder Creek; Saroj Pathak, Los Altos Hills, all of Calif.

[73] Assignee: Atmel Corporation, San Jose, Calif.

[21] Appl. No.: 726,956

[22] Filed: Oct. 7, 1996

[51] Int. Cl.$^6$ .................................................. H03K 17/687
[52] U.S. Cl. ........................ 327/525; 327/526; 327/143
[58] Field of Search ........................................ 327/525, 526, 327/403–406, 199, 200, 224, 143, 198; 365/225.7

[56] References Cited

U.S. PATENT DOCUMENTS

| | | | |
|---|---|---|---|
| 4,613,959 | 9/1986 | Jiang | 365/200 |
| 4,818,904 | 4/1989 | Kobayashi | 307/594 |
| 4,837,520 | 6/1989 | Golke et al. | 324/550 |
| 5,051,691 | 9/1991 | Wang | 324/158 R |
| 5,151,614 | 9/1992 | Yamazaki et al. | 307/272.3 |
| 5,315,177 | 5/1994 | Zagar et al. | 307/465 |
| 5,440,246 | 8/1995 | Murray et al. | 326/38 |
| 5,457,656 | 10/1995 | Fu | 365/200 |

*Primary Examiner*—Timothy P. Callahan
*Assistant Examiner*—An T. Luu
*Attorney, Agent, or Firm*—Thomas Schneck; George B. F. Yee

[57] ABSTRACT

A zero power fuse circuit includes a latch means having two inputs, a first input being latched to ground and a second input being latched to $V_{cc}$. The latch means is triggered either by a momentary contact of the first input to ground or by the momentary contact of the second input to $V_{cc}$. A first embodiment includes two fuse element/capacitor pairs each coupled to one of the two inputs of the latch means. A second embodiment includes a pull-up transistor and a fuse element/capacitor pair, coupled to the first and second inputs respectively. A third embodiment includes a pull-down transistor and a fuse element/capacitor pair respectively coupled to the second and first inputs of the latch means.

10 Claims, 2 Drawing Sheets

| ACTION | | RESPONSE | |
| --- | --- | --- | --- |
| | | At Terminal A | At Terminal B |
| Momentary Contact Between Terminal A and | $V_{cc}$ | Don't Care | Don't Care |
| | GND | Latch to GND | Latch to $V_{cc}$ |
| Momentary Contact Between Terminal B and | $V_{cc}$ | Latch to GND | Latch to $V_{cc}$ |
| | GND | Don't Care | Don't Care |

ZERO POWER FUSE CIRCUIT

TECHNICAL FIELD

The present invention generally relates to fuse circuits, and more specifically to zero static power fuse circuit architectures.

BACKGROUND ART

Fuse circuits are frequently used in a variety of semiconductor applications. For example, as the storage density of semiconductor devices such as memory devices, programmable logic devices, and the like continue to increase, the incidence of defective cells within any one device is likely to increase as well. Unless the defect can be corrected in some way, the particular defective semiconductor device becomes useless, thus lowering production yields. A common approach to correcting such defects is to provide a multitude of redundant cells within the device. When a defective cell is detected, one of the redundant cells can be used in its place.

The circuitry that supports the redundant cells usually includes fusible elements which are selectively "blown" in order to activate one or more of the redundant cells. Typically, such circuitry consumes power regardless of whether any of the redundant cells have been programmed to replace a defective cell.

Fuse circuits are also used to facilitate programming of programmable logic devices (PLD). Typically, logic cells in a PLD are fabricated to have a default logic level, whether it be a logic HI or a logic LO. This is accomplished by the presence of fusible links which tie the cells outputs either to $V_{cc}$ or to ground. When a fuse in a cell is blown, the cell's logic level is reversed. Not unlike the circuitry used with redundant memory cells, fuse circuitry in PLDs also consume power.

Consider, for example, a prior art fuse circuit such as one shown in FIG. 5. A resistor R is coupled in series with a fuse F, between $V_{cc}$ and ground. The node between the resistor and the fuse is fed into an inverter to provide an output Q. In the configuration shown in FIG. 5, the intact fuse ties the inverter input to ground, so that Q is HI. Meanwhile, a constant current is drawn from $V_{cc}$ to ground, through the resistor and the fuse F. When the fuse is blown, the inverter input is coupled to $V_{cc}$ and Q goes LO. In a typical application, any one of a number of such either is blown or remains intact. The which remain intact will always draw current from $V_{cc}$, the power being dissipated through the resistor R. These are inefficient, especially when used in smaller computing devices such as portable PCs where power is a premium.

What is needed is a fuse circuit which can be used in semiconductor devices that use programmable logic levels, and which does not consume power whether the fuse circuit remains intact or is blown.

SUMMARY OF THE INVENTION

The fuse circuit of the present invention includes a dual-triggered unidirectional latch means. In the context of this invention, a "dual-triggered" latch is a latch that can be triggered through either one of two inputs. In addition, the latch is "unidirectional" in that the first input can trigger the latch only by a momentary contact of the first input to ground, and the second input can trigger the latch only by a momentary contact of the second input to $V_{cc}$. Moreover, when the latch is triggered, the first input latches to ground and the second input latches to $V_{cc}$.

In a first embodiment, the fuse circuit includes the above latch means coupled with two series connected fuse element and capacitor pairs. A first logic level is provided by the fuse circuit when both fuse elements remain intact. A second logic level is provided when both fuses are blown. In a second embodiment, the fuse circuit includes the above-described latch means coupled to a pull-up transistor at a first terminal of the latch means, and a fuse element/capacitor combination coupled to the second terminal of the latch means. In a third embodiment of the present invention, a pull-down transistor is used in place of the pull-up transistor of the second embodiment.

In each embodiment, the capacitors serve to block DC current during the steady state condition when the fuse element are intact. Thus, a first logic level is provided without any power dissipation through the fuse circuit. When the fuse elements are blown, the capacitors provide a momentary coupling to ground or $V_{cc}$ when the circuit is powered up. This momentary contact is sufficient to operate the latch means, which reverses the logic levels. Since the latch draws essentially no power and the capacitors block DC current, there is virtually no power consumed in steady state when the fuse element is blown. Thus, whether the fuse element is blown or remains intact, the fuse circuit of the present invention operates with no static power dissipation.

BEST MODE OF CARRYING OUT THE INVENTION

Figure 1:
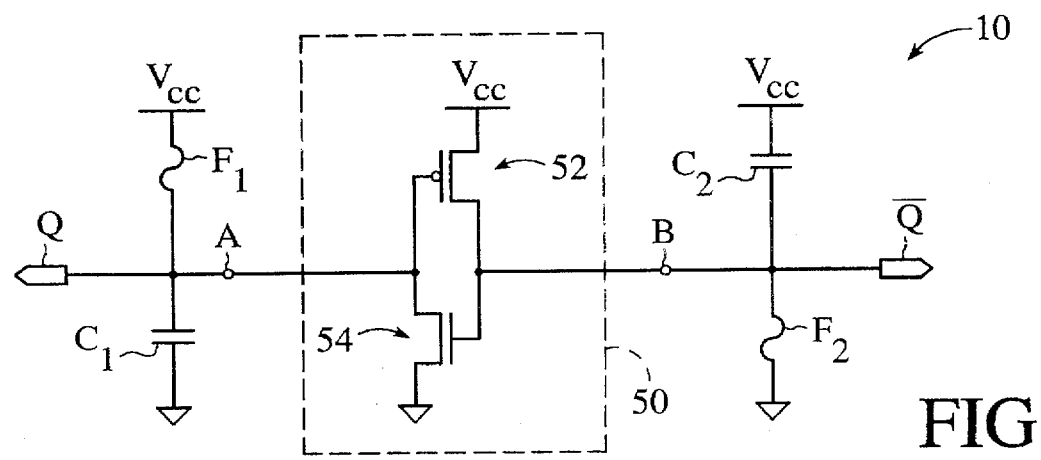
FIG. 1 is a first embodiment of a zero power fuse circuit of the present invention.

With respect to FIG. 1, a zero power fuse circuit 10 of the present invention includes a latch means 50 having two terminals A, B. Coupled to the A terminal is a series combination of a first fuse element $F_1$ and a first capacitor $C_1$. The fuse element $F_1$ is coupled to $V_{cc}$ and the capacitor $C_1$ is coupled to ground. Terminal B of the latch means 50 has a similar series combination of a second fuse $F_2$ and a second capacitor $C_2$. However, on terminal B, the second fuse element. $F_2$ is coupled to ground while the second capacitor $C_2$ is coupled to $V_{cc}$. The output logic Q, $\overline{Q}$ of the zero power fuse circuit 10 can be obtained from terminal A and terminal B, respectively.

Figures 4, 5:
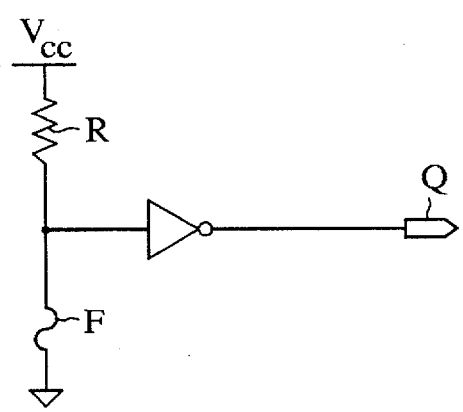
FIG. 4 is a table which defines a dual-triggered unidirectional latch in accordance with the present invention.
FIG. 5 shows a prior art fuse circuit.

The operation of latch means 50 is defined by the table shown in FIG. 4. As can be seen from the table under the RESPONSE column, when triggered, the latch responds by latching terminal A to ground GND and latching terminal B to $V_{cc}$. The latch means is triggered in one of two ways, as shown under the ACTION column of the table: either by contacting A to ground or by contacting B to $V_{cc}$. Note that only a momentary contact is needed to trigger the latch means; e.g. momentarily contacting terminal A to ground is sufficient to trigger the latch means 50. The table in FIG. 4 further shows that contacting A to $V_{cc}$ or contacting B to ground results in an undefined response, meaning that the response of the latch does not matter.

The latch means 50 hereinafter is defined as a dual-triggered unidirectional latch. The latch means is "dual-triggered" in the sense that the latch means 50 can be triggered by contacting A to ground or by contacting B to $V_{cc}$. The latch means 50 is "unidirectional" in that each terminal latches in one direction; i.e. terminal A will always latch to ground and terminal B will always latch to $V_{cc}$, when the latch is triggered.

In the preferred embodiment, the latch means 50 includes a P-channel MOS transistor 52 cross-coupled with an N-channel MOS transistor 54. More specifically, the drain of the PMOS transistor is coupled to $V_{cc}$ and the source of the NMOS transistor is coupled to ground. In the middle, the gate of the PMOS transistor 52 is coupled to the drain of the NMOS transistor 54, and the gate of the NMOS transistor is coupled to the source of the PMOS transistor. It is noted that any latch means circuitry which behaves in the manner as set forth in the table of FIG. 4 will work equally well in the zero power fuse circuit of the present invention.

Operation of the circuit of FIG. 1 will now be discussed. With the fuse elements $F_1$, $F_2$ intact, terminal A of the latch means 50 is tied to $V_{cc}$ and so the output Q is HI. Similarly, terminal B is tied to ground so that the output logic of $\overline{Q}$ is LO. In addition, since terminal A is at $V_{cc}$, the PMOS transistor 52 is non-conductive. Likewise, the NMOS transistor 54 is non-conducting since terminal B is at ground potential. The latch, therefore, is not triggered when the fuses are intact.

When both fuse elements F, $F_2$ are blown, terminal A will be momentarily coupled to ground through capacitor $C_1$ on power-up, pulling the gate of the PMOS transistor 52 to ground. At the same time, terminal B will be momentarily coupled to $V_{cc}$ through capacitor $C_2$, thus pulling the gate of the NMOS transistor 54 to $V_{cc}$. As the PMOS transistor becomes conductive, the gate of the NMOS transistor is pulled to $V_{cc}$ through the PMOS transistor. Likewise, as the NMOS transistor starts to conduct, the gate of the PMOS transistor is pulled to ground through the NMOS transistor. Consequently, terminal A latches to ground and terminal B is latched to $V_{cc}$. Thus, when the capacitors $C_1$, $C_2$ are charged and terminals A and B are no longer coupled through the capacitors, the terminals remain coupled respectively to ground and to $V_{cc}$ by virtue of the latch means 50. Thus, Q is LO when the fuse element is blown, and $\overline{Q}$ is HI. From the foregoing, it can be seen that the circuit of the latch means 50 shown in FIG. 1 operates in accordance with the definition of the latch as set forth in the table in FIG. 4.

Thus, in the case where the fuses $F_1$, $F_2$ are intact, a HI is available at Q (conversely, a LO is available at $\overline{Q}$). The capacitors $C_1$ and $C_2$ both serve to block DC current from $V_{cc}$ to ground, and so no power is consumed through the two fuse element/capacitor pairs. Similarly, since neither the PMOS transistor nor the NMOS transistor is conducting when the fuse elements $F_1$, $F_2$ are intact, no power is drawn through the transistors.

In the case where the fuse elements $F_1$, $F_2$ are blown, Q is LO (conversely, $\overline{Q}$ is HI). Since the transistors 52, 54 of the latch means are cross-coupled to the gates so as to bias each other, they draw no power. Thus, excluding the initial current draw to charge the capacitors $C_1$, $C_2$, there is no power consumed when the fuse elements are blown. The zero power fuse circuit of FIG. 1, therefore is able to provide both a HI and a LO logic level without consuming power.

Figure 2:
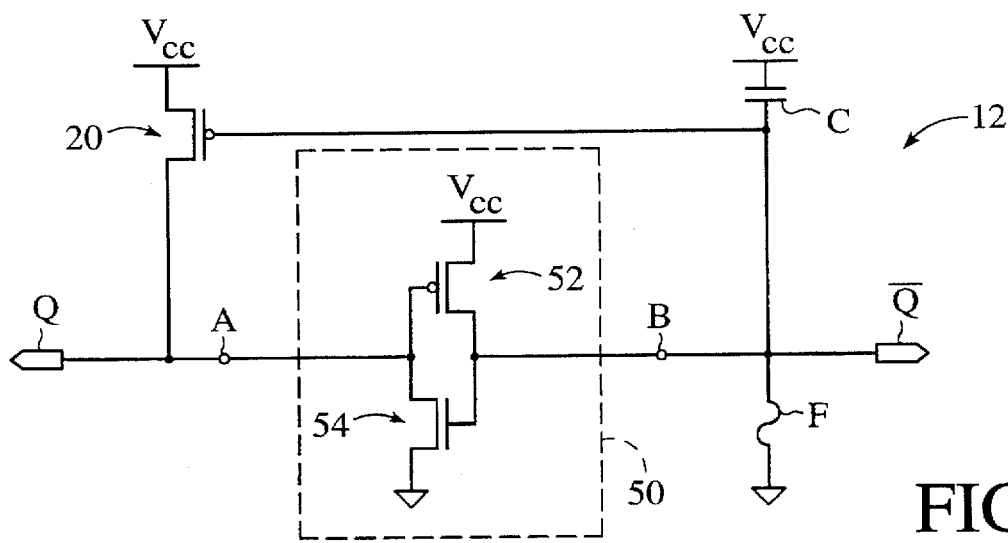
FIG. 2 shows a second embodiment of a zero power fuse circuit of the present invention.

Turn now to an alternate embodiment of the zero power fuse elements 12 shown in FIG. 2. In this embodiment, a fuse element F is coupled between terminal B of the latch means 50 and ground. A capacitor C is coupled between $V_{cc}$ and terminal B. A PMOS pull-up transistor 20 includes a source terminal coupled to $V_{cc}$ and a drain terminal coupled to terminal A of the latch means 50. The gate of the PMOS transistor is coupled to terminal B.

Consider first the operation of the fuse circuit 12 when the fuse element F is intact. Terminal B is tied to ground through the fuse element, and so Q is LO. With terminal B grounded, the PMOS transistor 20 is conductive, thus pulling Q HI. In this configuration, there is no current draw through the fuse circuit 12 since the capacitor C blocks DC current from $V_{cc}$ to ground. Likewise, there is no current through the pull-up transistor 20, since the latch transistor 54 is OFF.

When the fuse element F is blown, terminal B is momentarily coupled to $V_{cc}$ through the capacitor C. In accordance with the table in FIG. 4 and with the foregoing explanation, the result is that terminal A latches to ground (via transistor 54) and terminal B latches to $V_{cc}$ (via transistor 52). Thus, $\overline{Q}$ goes HI and Q goes LO. The PMOS transistor 20 is non-conductive since terminal B is at $V_{cc}$, thus cutting off the current path from $V_{cc}$ through transistors 20 and 54 to ground. Thus, as with the circuit of FIG. 1, the circuit in FIG. 2 exhibits the property of "zero" power consumption whether the fuse element F is intact or not.

Figure 3:
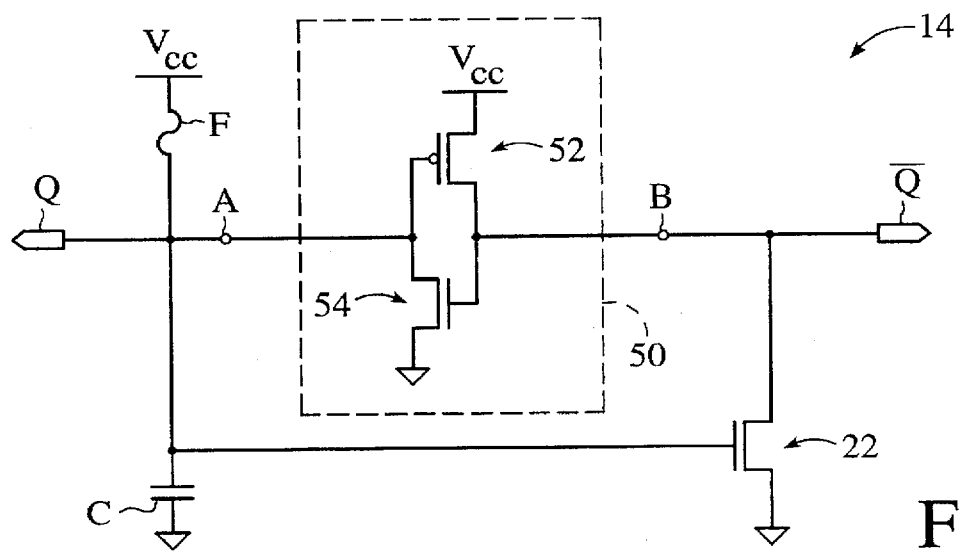
FIG. 3 illustrates a third embodiment of a zero power fuse circuit of the present invention.

Turn now to yet another embodiment of the zero power fuse circuit 14 shown in FIG. 3. In this embodiment, a fuse element F is coupled between $V_{cc}$ and terminal A of the latch means 50. A capacitor C is coupled between terminal A and ground. An NMOS pull-down transistor 22 is coupled between terminal B of the latch and ground, through the source and drain pins of the NMOS transistor respectively. The gate of the NMOS transistor 22 is coupled to terminal A of the latch.

In the configuration wherein the fuse element is intact, terminal A is tied to $V_{cc}$, and so Q is HI. Since terminal A is at $V_{cc}$, the NMOS transistor 22 is conductive, thus pulling both terminal B and $\overline{Q}$ LO. When the fuse element F is blown, terminal A is momentarily coupled to ground through the capacitor C. Referring to the table in FIG. 4, a momentary contact of A to ground has the effect of latching terminal A to ground and latching terminal B to $V_{cc}$. Thus, Q goes LO and remains LO, and $\overline{Q}$ goes HI and remains HI. As with the embodiments of FIGS. 1 and 2, there is no current draw through the circuit 14 in steady state, and therefore no power loss.

With respect to the transistors used in the embodiments of FIGS. 1–3, it is desirable to fabricate the devices using similarly sized device geometries, e.g. channel regions having the same width-to-length (W/L) ratios. This has the advantage of facilitating device layout since all of the devices are of similar size and configuration. Another advantage inheres in the fact that device density is maximized. Having substantially uniform device geometries allows for a more efficient layout of the devices on the silicon with little wasted space, resulting in a more compact layout of device elements. This is an important consideration in light of the desire to provide high device-count devices. In like fashion, the capacitors shown in the embodiments of FIGS. 1–3 are constructed in accordance with the same criteria.

Sensitivity to process variations is minimized by designing with similarly sized devices. Variations in the process which affect the geometry of the device will equally affect all of the devices, and so will not adversely impact the final product.

Preferably, the W/L ratio of the channel regions of the transistor devices is 3/1, but this is not critical. The invention works equally well with other W/L ratios. Although a higher W/L ratio in the channel region yields faster response times, transistor switching speed is not a factor in the present invention. It is only when the zero power fuse circuit is powered up that transistor switching may take place, and then only for a short time. However, once the steady state condition is achieved, there is no further switching required of the transistors since the task of the zero power fuse circuit is to provide a constant logic level. Thus, the operating speed of the zero power fuse circuit of the present invention is not a concern. On the other hand, it is desirable to have uniform and minimum device geometries for the reasons noted above, and so a small W/L ratio is preferred. Likewise, the capacitors are fabricated with the same W/L ratio so that size uniformity among the devices can be maintained.

We claim:

1. A fuse circuit for connection between first and second voltage potentials to provide a selectable logic level, said fuse comprising:
    a dual-triggered unidirectional latch having first and second terminals, including a means for latching said first and second potentials respectively to said first and second terminals, said latching means being triggered by at least a momentary contact either between said first terminal and said first potential or between said second terminal and said second potential;
    a fuse coupled between said first potential and said first terminal;
    a capacitor coupled between said first terminal and said second potential; and
    a first N-channel MOS transistor having first and second pins respectively coupled to said second terminal and said second potential, and further having a control gate coupled to said first terminal;
    whereby said selectable logic level is available at either of said first terminal and said second terminal.

2. The fuse circuit of claim 1 wherein said latching means includes a P-channel MOS transistor and a second N-channel MOS transistor, first and second pins of said P-channel transistor respectively coupled to said first potential and said second terminal, first and second pins of said second N-channel transistor respectively coupled to said second potential and said first terminal, a control pin of said P-channel transistor coupled to said second pin of said second N-channel transistor, and a control pin of said second N-channel transistor coupled to said second pin of said P-channel transistor.

3. The fuse circuit of claim 2 wherein said first potential is $V_{cc}$ and said second potential is ground.

4. The fuse circuit of claim 2 wherein said first and second N-channel transistors and said P-channel transistor have substantially equal device width and device length dimensions.

5. The fuse circuit of claim 2 wherein the width-to-length ratio of each of said first and second N-channel transistors and said P-channel transistor is 3/1.

6. A fuse circuit for connection between first and second voltage potentials to provide a selectable logic level, said fuse comprising:
    a dual-triggered unidirectional latch having first and second terminals, including a means for latching said first and second potentials respectively to said first and second terminals, said latching means being triggered by at least a momentary contact either between said first terminal and said first potential or between said second terminal and said second potential;
    a fuse coupled between said second potential and said second terminal;
    a capacitor coupled between said second terminal and said first potential; and
    a first P-channel MOS transistor having first and second pins respectively coupled to said first terminal and said first potential, and further having a control gate coupled to said second terminal;
    whereby said selectable logic level is available at either of said first terminal and said second terminal.

7. The fuse circuit of claim 6 wherein said latching means includes a second P-channel MOS transistor and an N-channel MOS transistor, first and second pins of said second P-channel transistor respectively coupled to said first potential and said second terminal, first and second pins of said N-channel transistor respectively coupled to said second potential and said first terminal, a control pin of said second P-channel transistor coupled to said second pin of said N-channel transistor, and a control pin of said N-channel transistor coupled to said second pin of said second P-channel transistor.

8. The fuse circuit of claim 7 wherein said first potential is $V_{cc}$ and said second potential is ground.

9. The fuse circuit of claim 7 wherein width-to-length ratios of the device geometries of said first and second P-channel transistors and said N-channel transistor are substantially equal.

10. The fuse circuit of claim 7 wherein the width-to-length ratio of each of said first and second P-channel transistors and said N-channel transistor is 3/1.

* * * * *

UNITED STATES PATENT AND TRADEMARK OFFICE
CERTIFICATE OF CORRECTION

PATENT NO : 5,731,734
DATED : March 24, 1998
INVENTOR(S): Jagdish Pathak et al.

It is certified that error appears in the above-identified patent and that said Letters Patent is hereby corrected as shown below:

Column 1, line 32, "cells outputs" should read -- cells' outputs --.

Column 1, line 46, "such either" should read -- such fuse circuits either --.

Column 1, line 47, "The which" should read -- The fuse circuits which --.

Column 1, line 49, "These are" should read -- These fuse circuits are --.

Column 2, lines 14-15, "fuse element are intact" should read -- fuse elements are intact --.

Column 3, line 27, "fuse elements F, $F_2$" should read -- fuse elements $F_1$, $F_2$ --.

Column 3, line 64, "fuse elements 12" should read -- fuse circuit 12 --.

Signed and Sealed this

Thirtieth Day of June, 1998

*Attest:*

BRUCE LEHMAN

*Attesting Officer*        *Commissioner of Patents and Trademarks*